United States Patent
Ma et al.

(10) Patent No.: US 10,468,266 B2
(45) Date of Patent: Nov. 5, 2019

(54) DRY ETCHING METHOD

(71) Applicant: BOE TECHNOLOGY GROUP CO., LTD., Beijing (CN)

(72) Inventors: Yinghai Ma, Beijing (CN); Liangjian Li, Beijing (CN); Yueping Zuo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 11 days.

(21) Appl. No.: 15/546,475

(22) PCT Filed: Apr. 7, 2016

(86) PCT No.: PCT/CN2016/078687
§ 371 (c)(1),
(2) Date: Jul. 26, 2017

(87) PCT Pub. No.: WO2016/177251
PCT Pub. Date: Nov. 10, 2016

(65) Prior Publication Data
US 2018/0025915 A1  Jan. 25, 2018
US 2018/0233376 A9  Aug. 16, 2018

(30) Foreign Application Priority Data
May 6, 2015 (CN) .......... 2015 1 0226706

(51) Int. Cl.
| H01L 21/311 | (2006.01) |
| H01L 21/768 | (2006.01) |
| H01J 37/32 | (2006.01) |
| G02F 1/1368 | (2006.01) |
| H01L 27/12 | (2006.01) |

(52) U.S. Cl.
CPC .... H01L 21/31116 (2013.01); H01J 37/3244 (2013.01); H01J 37/32871 (2013.01);
(Continued)

(58) Field of Classification Search
CPC ......... H01L 21/31116; H01L 21/76805; H01L 27/1259; H01J 37/32871; H01J 37/3244;
(Continued)

(56) References Cited

U.S. PATENT DOCUMENTS

| 6,207,532 B1 | 3/2001 | Lin et al. |
| 2004/0253823 A1* | 12/2004 | Taq ................... H01L 21/31116 |
| | | 438/691 |

(Continued)

FOREIGN PATENT DOCUMENTS

| CN | 1507502 A | 6/2004 |
| CN | 104143522 A | 11/2014 |
| CN | 104779153 A | 7/2015 |

OTHER PUBLICATIONS

S. Wolf and R.N. Tauber, (Silicon Processing for the VLSI Era, vol. 1—Process Technology, Lattice Press, 1986) (pp. 551-555) . Used Only as Evidence. (Year: 1986).*

(Continued)

*Primary Examiner* — Nadine G Norton
*Assistant Examiner* — Mahmoud Dahimene
(74) *Attorney, Agent, or Firm* — Armstrong Teasdale LLP

(57) ABSTRACT

A dry etching method includes performing at least two etching steps, and further includes injecting protective gas into an etch chamber for processing between any two successive etching steps, wherein the protective gas generates plasma to neutralize electrons accumulated on a side wall of an etching trench. According to the present disclosure, hydrogen plasma is added in an etching process to remove the electrons accumulated on the side wall of the etching trench so as to reduce the microetching effect in multiple etching. In this way, process stability and reliability of a display substrate are improved.

8 Claims, 3 Drawing Sheets

(52) U.S. Cl.
CPC ...... *H01L 21/76805* (2013.01); *G02F 1/1368* (2013.01); *G02F 2202/104* (2013.01); *H01J 2237/334* (2013.01); *H01J 2237/3347* (2013.01); *H01L 27/1259* (2013.01)

(58) Field of Classification Search
CPC ........ H01J 2237/334; H01J 2237/3347; G02F 2202/104; G02F 1/1368
See application file for complete search history.

(56) References Cited

U.S. PATENT DOCUMENTS

| | | | |
|---|---|---|---|
| 2010/0099264 A1* | 4/2010 | Elers | H01L 21/31122 438/710 |
| 2011/0260299 A1 | 10/2011 | Edwards et al. | |
| 2014/0199849 A1* | 7/2014 | Mani | H01L 21/32137 438/720 |

OTHER PUBLICATIONS

PCT International Search Report, Application No. PCT/CN2016/078687, dated Jul. 11, 2016, 4 pages.: with English translation.
PCT Written Opinion, Application No. PCT/CN2016/078687, dated Jul. 11, 2016, 5 pages.: with English translation.
China First Office Action, Application No. 201510226706.4, dated Dec. 7, 2015, 12 pps.: with English translation.
Liu Yan-hong et al., "Two modes of devices damage during plasma processing", Semiconductor Technology, vol. 27, No. 3, Mar. 2002, 6 pages.: with English abstract.

\* cited by examiner

DRY ETCHING METHOD

CROSS REFERENCE TO RELATED APPLICATIONS

This patent application is a National Stage Entry of PCT/CN2016/078687 filed on Apr. 7, 2016, which claims the benefit and priority of Chinese Patent Application No. 201510226706.4 filed on May 6, 2015, the disclosures of which are incorporated herein by reference as a part of the present application.

BACKGROUND

The present disclosure relates to a dry etching method, and pertains to a field of semiconductor technologies.

Dry etching (or dry etching technique) is a technique for thin film etching using plasma. Gases have the following two characteristics when existing in the form of plasma: on one hand, chemical activity of the gases in plasma is much higher than that in a normal state, the appropriate gas is selected according to different etched materials, quicker reaction with the materials can be realized to achieve the objective of etching and removal; and on the other hand, the plasma can also be guided and accelerated by an electric field so that the plasma has certain energy, and thus when the plasma bombards the surface of an object being etched, the plasma can hit out atoms of the materials of the etched object. In this way, the objective of etching can be achieved by physical energy transfer. Therefore, dry etching is a result of balance of a physical process and a chemical process on a wafer surface. The general dry etching method is as below: molecules or molecular groups capable of producing ion chemical reaction with a thin film are generated using glow discharge of a particular gas (or a mixed gas) under a pressure of 10~1,000 Pa, and the generated reaction product is volatile. Next, the generated reaction product is pumped away in a low-pressure vacuum chamber. In this way, etching can be achieved.

At present, in a deep via-hole plasma etching process of preparation for a low-temperature polysilicon thin-film transistor array substrate, positive/negative charges may be accumulated in a local area of the substrate due to nonuniformity of distribution of the plasma in an etch chamber. Moreover, the presence of a plasma sheath makes ions and electrons distribute in different locations: the electrons are accumulated on a side wall of an etching trench, whereas the ions are accumulated at the bottom of the trench. As shown in FIG. 1, to etch a via hole reaching a metal layer 4 on an insulating layer 3, in the process of etching, some microetching 2 may occur because a direction of physical etching is changed due to an effect of the electrons accumulated on the side wall of the etching trench on positive ions in etching gas, wherein 1 represents a photoresist layer, 5 represents a buffer layer, and 6 represents the substrate. The microetching may cause a decrease of stability and reliability of a liquid crystal display panel.

SUMMARY

The embodiments of the present disclosure may at least partially reduce the microetching effect during dry etching.

The embodiments of the present disclosure provides a dry etching method, including performing at least two etching steps within an etch chamber, and adding plasma into an etch chamber between any two successive etching steps, wherein the plasma neutralizes electrons accumulated on a side wall of an etching trench.

In one embodiment, adding plasma further includes injecting protective gas, and processing the protective gas to generate the plasma.

In one embodiment, the method further includes removing an etching gas in the etch chamber before adding the plasma.

In one embodiment, removing the etching gas in the etch chamber further includes setting a source power or bias voltage to zero, and injecting the protective gas at a predetermined pressure and a predetermined flow rate within a predetermined time.

In one embodiment, the predetermined pressure is 50 millitorr (mTorr), the predetermined flow rate is 1,000 standard cubic centimeter per minute (sccm), and the predetermined time is 10 seconds (s).

In one embodiment, the method further includes removing the protective gas in the etch chamber after adding the plasma.

In one embodiment, removing the protective gas in the etch chamber further includes setting a source power or bias voltage to zero, and injecting a predetermined amount of an etching gas at a predetermined pressure.

In one embodiment, a pressure of the etch chamber and a gas flow/flow rate of the injected etching gas are equal to those in a next etching step.

In one embodiment, an injection time of the etching gas is 10 seconds (s).

In one embodiment, adding a plasma into an etch chamber further includes setting a predetermined chamber pressure, a predetermined source power, and a predetermined bias voltage, and injecting the protective gas at a predetermined flow rate within a predetermined time.

In one embodiment, the predetermined chamber pressure is 50 millitorr (mTorr), the predetermined source power is 500 watts (W), the predetermined bias voltage is 0 volts (V), the predetermined flow rate is 1,000 standard cubic centimeter per minute (sccm), and the predetermined time is 10-20 seconds (s).

In one embodiment, the two successive etching steps include a main etching step and an over etching step, wherein the dry etching method further includes injecting a protective gas into the etch chamber for processing between the main etching step and the over etching step.

In one embodiment, the protective gas is hydrogen.

According to the dry etching method provided by the present disclosure, hydrogen plasma is added in an etching process to remove the electrons accumulated on the side wall of the etching trench so as to reduce the microetching effect in multiple etching. In this way, process stability and reliability of a display substrate are improved.

DETAILED DESCRIPTION

Detailed description of implementations of the present disclosure will further be made with reference to drawings and embodiments in order to make the above objects, technical solutions and advantages of the embodiments of the present disclosure more apparent. The following embodiments are intended to describe the present disclosure but are not intended to limit the scope of the present disclosure. All other embodiments obtained by persons of ordinary skill in the art based on the embodiments described in the present disclosure shall fall within the protection scope of the present disclosure.

Unless otherwise defined, all the technical or scientific terms used herein have the same meanings as commonly understood by one of ordinary skill in the art to which the present disclosure belongs. The terms "first", "second" and so on used in the specification and claims of the present disclosure do not denote any sequence, quantity or importance, but instead are merely used to distinguish different constituent parts. Likewise, the terms such as "a", "an" and so on do not indicate quantitative limitation, but indicate the existence of at least one. The terms "connect" or "connection" and so on are not limited to physical or mechanical connection, and also may include electrical connection, either directly or indirectly. "On," "under," "right," "left" and the like are only used to indicate relative position relationship, and when the absolute position of the object which is described is changed, the relative position relationship may be changed accordingly.

The present disclosure provides a dry etching method, which includes performing at least two etching steps, and injecting protective gas into an etch chamber for processing between any two successive etching steps. The protective gas generates plasma to neutralize electrons accumulated on a side wall of an etching trench. Between any two successive etching steps, the dry etching method further includes injecting protective gas into the etch chamber and making the protective gas generate a plasma to neutralize electrons accumulated on the side wall of the etching trench. Therefore, microetching generated in the subsequent etching step due to the electrons accumulated in the previous etching step can be reduced or even avoided.

In the present disclosure, the step of injecting protective gas may be added between any two successive etching steps for the purpose of completing an etching process. The dry etching in the present disclosure may be a via hole etching or other etching. For ease of understanding, the dry etching method provided by the present disclosure is described in detail by taking via hole etching as an example in which a step of injecting protective gas is added between main etching and over etching.

Figure 1:
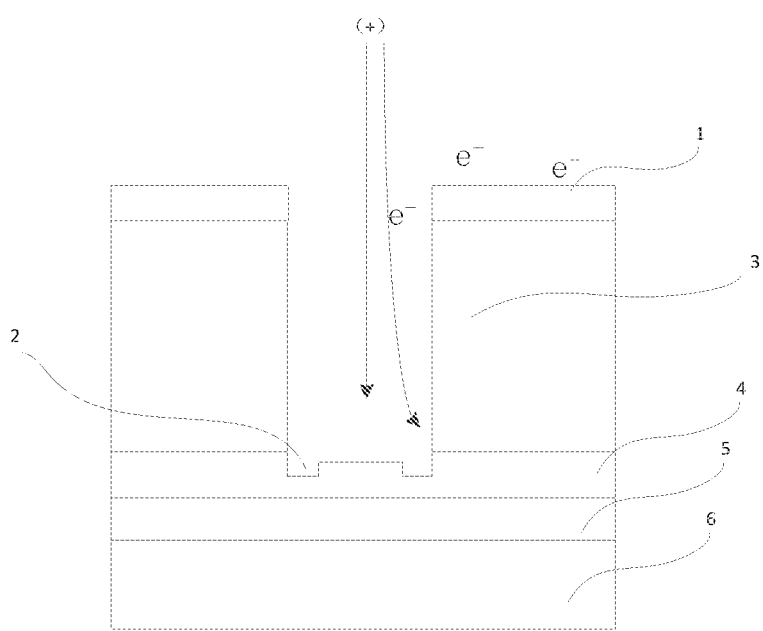
FIG. 1 is a schematic diagram of generating the microetching effect by dry etching in the prior art.
Figure 2:
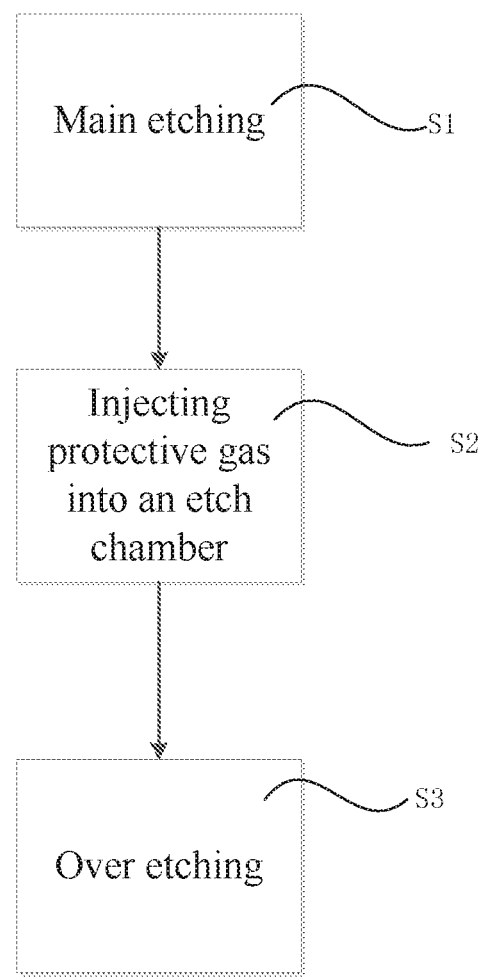
FIG. 2 is a schematic flow diagram of a dry etching method according to the present disclosure.

As shown in FIG. 2, the over etching hole includes a main etching step S1 and an over etching step S3. The main etching generally is used for etching a large part of a to-be-etched layer to obtain an ideal section of the side wall of the etching trench. Whereas the over etching is used for removing etch residues and the remaining to-be-etched layer to achieve penetration, generally a part of an underlying layer of the to-be-etched layer may be etched. A step S2 of injecting protective gas into the etch chamber for processing is further provided between the main etching and the over etching. In the step S2, the protective gas generates the plasma to neutralize the electrons accumulated on the side wall of the etching trench (i.e., the via hole). Thus, the electrons accumulated on the side wall of the via hole are neutralized by the plasma generated by the protective gas during the main etching, so that the microetching in FIG. 1 may be alleviated or even prevented. The dry etching method provided by the present disclosure is described in detail as below.

In the present disclosure, active gas, such as oxygen, may be used in the process of etching, to prevent a risk (for example, explosion) generated by mixing of the oxygen and the injected protective gas, preferably, the etching gas in the etch chamber needs to be cleared away before injecting the protective gas. When removing the etching gas in the etch chamber, a source power or bias voltage is set to zero, and the protective gas is injected at a predetermined pressure and a predetermined flow rate within a predetermined time. As the protective gas is injected, the etching gas may be discharged by the protective gas from the etch chamber. In one embodiment, when the etching gas is removed, the predetermined pressure is 50 millitorr (mTorr), the predetermined flow rate is 1,000 standard cubic centimeter per minute (sccm), and the predetermined time is 10 seconds (s).

A certain amount of protective gas is injected into the etch chamber in the process of etching, and the protective gas may generate a certain plasma under certain conditions (for example, by powering up). The plasma may neutralize the electrons accumulated on the side wall of the etching trench. In this way, the electrons accumulated on the side wall of the etching trench may be removed. Therefore, the microetching effect may be effectively prevented, and the stability and reliability of the display substrate may be improved. In one embodiment of the present disclosure, the protective gas is hydrogen. It is to be understood that the present disclosure is not limited thereto, and other gases capable of generating plasmas in the etch chamber to neutralize the electrons accumulated on the side wall of the etching trench may still be in the scope of the present disclosure, which are not enumerated herein. In the following, injecting protective gas into the etch chamber for processing is described in detail according to an exemplary solution where the protective gas is hydrogen. A predetermined chamber pressure, a predetermined source power and a predetermined bias voltage are set, and the protective gas (hydrogen) is injected at a predetermined flow rate within a predetermined time. Particles and electrons generation by hydrogen under predetermined conditions may be as shown in Formula (1):

$$H_2 \rightarrow 2H^+ + 2e^- \tag{1}$$

Ions generated after ionization of hydrogen neutralize the electrons accumulated on the side wall of the etching trench to generate hydrogen, as shown in Formula (2):

$$2H^+ + 2e^- \rightarrow H_2 \tag{2}$$

After a certain amount of hydrogen is injected into the etch chamber, the electrons accumulated on the side wall of the etching trench are neutralized by ionized hydrogen particles. In one embodiment, the conditions for processing the protective gas injected into the etch chamber are as below: the predetermined chamber pressure is 50 millitorr (mTorr), the predetermined source power is 500 watts (W), the predetermined bias voltage is 0 volts (V), the predetermined flow rate is 1,000 standard cubic centimeter per minute (sccm), and the predetermined time is 10-20 seconds (s).

Since oxygen may be used in the process of etching, to prevent a dangerous chemical reaction (for example, explosion) generated by mixing of the injected etching gas and the protective gas in the etch chamber, the hydrogen in the etch chamber needs to be cleared away after the protective gas is injected into the etch chamber for processing. When removing the protective gas in the etch chamber, the source power or bias voltage is set to zero, and a predetermined amount of etching gas is injected at a predetermined pressure. As the etching gas is injected, the protective gas may be discharged, by the etching gas, from the etch chamber. In one embodiment, when the protective gas is removed, the pressure of the etch chamber and gas flow/flow rate of the injected etching gas are equal to those in a next etching step, and the time for injecting the etching gas may be 10 seconds (s).

Figure 3:
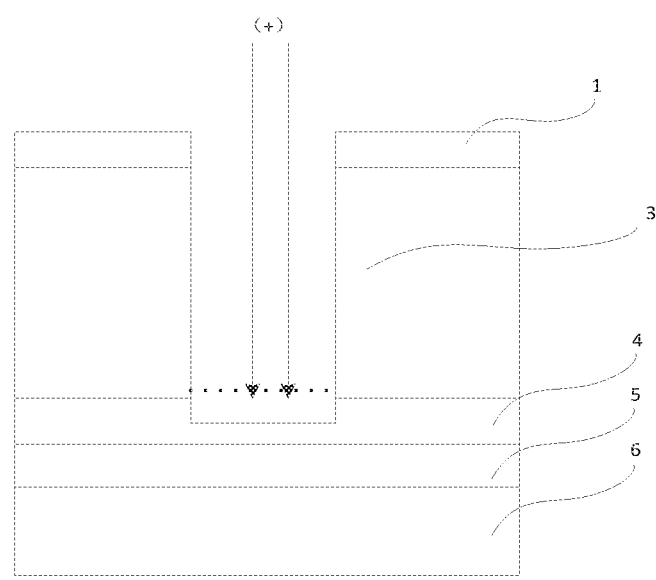
FIG. 3 is a schematic diagram of avoiding the microetching effect according to dry etching of the present disclosure.

As shown in FIG. 3, the dry etching method provided by the present disclosure is described in detail by taking forming a via hole by etching as an example herein below. First, the main etching is employed to etch a large part of the insulating layer 3 beneath a missing part of the photoresist layer 1 without damaging the metal layer 4 (for example, the portion above the dotted line in FIG. 3 is etched) to obtain an ideal section of the side wall of the etching trench. Next, the etching gas is removed from the etch chamber. In one embodiment, the pressure is 50 millitorr (mTorr), the predetermined flow rate is 1,000 standard cubic centimeters per minute (sccm), and the time for injecting hydrogen is 10 seconds (s). As the hydrogen is injected, the etching gas may be discharged, by the hydrogen, from the etch chamber. Next, a certain amount of hydrogen is injected into the etch chamber. In one embodiment, the chamber pressure is 50 millitorr (mTorr), the source power is 500 watts (W), the bias voltage is 0 volts (V), the flow rate is 1,000 standard cubic centimeters per minute (sccm), and the injection time is 10-20 seconds (s). After a certain amount of hydrogen is injected into the etch chamber, the hydrogen may generate a certain plasma under certain conditions (for example, by powering up). The electrons accumulated on the side wall of the etching trench are neutralized by ionized hydrogen particles. To prevent residual hydrogen from reacting with an active gas, such as oxygen, injected into the etching gas during over etching, the hydrogen in the etch chamber needs to be cleared away after the hydrogen is injected into the etch chamber for processing. When removing the hydrogen in the etch chamber, the source power or bias voltage is set to zero, and a predetermined amount of etching gas is injected at a predetermined pressure for a next etching process (namely, over etching). As the etching gas is injected, the hydrogen may be discharged, by the etching gas, from the etch chamber. Finally, the over etching is implemented to remove the etching residuals and the residual insulating layer 3 to ensure that the via hole reaches the metal layer 4. Through the above method, no microetching may occur because the electrons on the side wall of the etching trench are neutralized by the plasma in the hydrogen.

In an embodiment of the present disclosure, etching is carried out twice. However, the present disclosure is not limited to etching twice, and an appropriate number of etching may be carried out as needed.

In conclusion, according to the dry etching method provided by the present disclosure, a plasma (such as hydrogen plasma) is added in an etching process to remove the electrons accumulated on the photoresist layer 1 so as to reduce the microetching effect, which is applicable to via hole etching. In this way, the process stability and reliability of a display substrate can be improved.

The above implementations are merely intended for describing the present disclosure, and are not restrictive of the present disclosure. Persons of ordinary skill in the art may make various variations and modifications without departing from the spirit and scope of the present disclosure. Therefore, all equivalent technical solutions also fall within the scope of the present disclosure, and the patent protection scope of the present disclosure shall be limited by the claims.

The invention claimed is:

1. A dry etching method, comprising:
   performing at least two etching steps within an etch chamber; and
   adding plasma into the etch chamber between a main etching step and an over etching step, wherein the main etching step is used for etching a portion of a to-be-etched layer and the over etching step is used for removing etch residues and a remainder of the to-be-etched layer, wherein the plasma neutralizes electrons accumulated on a side wall of an etching trench, wherein the etching gas during the main etching step includes oxygen, and wherein the etching gas during the over etching step includes oxygen;
   wherein adding plasma further comprises injecting hydrogen, and processing the hydrogen to generate the plasma;
   and wherein the method further comprises removing an etching gas in the etch chamber before adding the plasma, and removing hydrogen in the etch chamber after adding the plasma.

2. The dry etching method according to claim 1, wherein removing the etching gas in the etch chamber further comprises:
   setting at least one of a source power and a bias voltage to zero; and
   injecting hydrogen at a predetermined pressure and a predetermined flow rate within a predetermined time.

3. The dry etching method according to claim 2, wherein the predetermined pressure is 50 millitorr (mTorr), the predetermined flow rate is 1,000 standard cubic centimeter per minute (sccm), and the predetermined time is 10 seconds (s).

4. The dry etching method according to claim 1, wherein removing hydrogen in the etch chamber further comprises:
   setting at least one of a source power and a bias voltage to zero; and
   injecting a predetermined amount of an etching gas at a predetermined pressure.

5. The dry etching method according to claim 4, wherein a pressure of the etch chamber and a gas flow/flow rate of the injected etching gas are equal to those in a next etching step of the at least two etching steps.

6. The dry etching method according to claim 5, wherein an injection time of the etching gas is 10 seconds (s).

7. The dry etching method according to claim 1, wherein adding plasma into the etch chamber further comprises:
   setting a predetermined chamber pressure, a predetermined source power, and a predetermined bias voltage; and
   injecting hydrogen at a predetermined flow rate within a predetermined time.

8. The dry etching method according to claim 7, wherein the predetermined chamber pressure is 50 millitorr (mTorr), the predetermined source power is 500 watts (W), the predetermined bias voltage is 0 volts (V), the predetermined flow rate is 1,000 standard cubic centimeter per minute (sccm), and the predetermined time is 10-20 seconds (s).

* * * * *

UNITED STATES PATENT AND TRADEMARK OFFICE
CERTIFICATE OF CORRECTION

PATENT NO. : 10,468,266 B2
APPLICATION NO. : 15/546475
DATED : November 5, 2019
INVENTOR(S) : Yinghai Ma et al.

Page 1 of 1

It is certified that error appears in the above-identified patent and that said Letters Patent is hereby corrected as shown below:

In the Specification

Column 4, Line 46, delete "$2H^1 + 2e^- \rightarrow H_2$" and insert therefor -- $2H^+ + 2e^- \rightarrow H_2$ --.

Signed and Sealed this
Twenty-fourth Day of December, 2019

Andrei Iancu
*Director of the United States Patent and Trademark Office*